(12) United States Patent
Reznicek et al.

(10) Patent No.: US 11,075,273 B1
(45) Date of Patent: Jul. 27, 2021

(54) NANOSHEET ELECTROSTATIC DISCHARGE STRUCTURE

(71) Applicant: International Business Machines Corporation, Armonk, NY (US)

(72) Inventors: Alexander Reznicek, Troy, NY (US); Xin Miao, Slingerlands, NY (US); Choonghyun Lee, Rensselaer, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/808,504

(22) Filed: Mar. 4, 2020

(51) Int. Cl.
*H01L 29/423* (2006.01)
*H01L 29/06* (2006.01)
(Continued)

(52) U.S. Cl.
CPC .... *H01L 29/42392* (2013.01); *H01L 21/0262* (2013.01); *H01L 21/02532* (2013.01);
(Continued)

(58) Field of Classification Search
CPC ......... H01L 21/02518; H01L 21/02521; H01L 21/02532; H01L 21/0259; H01L 21/02603;
(Continued)

(56) References Cited

U.S. PATENT DOCUMENTS 9,941,405 B2 4/2018 Kittl et al.
2018/0102359 A1 4/2018 Cheng et al.
(Continued)

FOREIGN PATENT DOCUMENTS

EP 2546883 A2 1/2013
IN 201741037148 A 10/2018

OTHER PUBLICATIONS

IBM, "Low capacitance ESD diodes formed in ZeroVT well", An IP.com Prior Art Database Technical Disclosure, IP.com No. IPCOM000015556D, Electronic Publication Date Jun. 20, 2003, 7 pages.
Chen et al., "ESD Protection Diodes in Bulk Si Gate-All-Around Vertically Stacked Horizontal Nanowire Technology", IEEE Transactions on Device and Materials Reliability, vol. 19, No. 1, Mar. 2019, pp. 112-119.
(Continued)

*Primary Examiner* — Cheung Lee
(74) *Attorney, Agent, or Firm* — Edward J. Wixted, III

(57) ABSTRACT

Embodiments of the invention include a method for fabricating a semiconductor device and the resulting structure. A stack of alternating nanosheets of sacrificial semiconductor material nanosheets and semiconductor material nanosheets located on a surface of a substrate are provided, wherein a sacrificial gate structure and a dielectric spacer material layer straddle over the nanosheet stack. End portions of each of the sacrificial semiconductor material nanosheets are recessed. A dielectric spacer is formed within each recess. Doped semiconductor portions are formed on the physically exposed sidewalls of each semiconductor material nanosheet and on the surface of the substrate. The semiconductor structure is thermally annealed. The sacrificial gate, each sacrificial semiconductor material nanosheet, and the dielectric spacer are each removed. A doped epitaxial material structure is formed in regions occupied by each sacrificial semiconductor material nanosheet, where the doped epitaxial material structure wraps around each suspended semiconductor material nanosheet.

20 Claims, 10 Drawing Sheets

(51) Int. Cl.
  *H01L 29/165* (2006.01)
  *H01L 29/167* (2006.01)
  *H01L 21/324* (2006.01)
  *H01L 21/02* (2006.01)
  *H01L 21/225* (2006.01)
  *H01L 29/36* (2006.01)
  *H01L 27/02* (2006.01)

(52) U.S. Cl.
  CPC .... *H01L 21/02603* (2013.01); *H01L 21/2251* (2013.01); *H01L 21/324* (2013.01); *H01L 29/0673* (2013.01); *H01L 29/165* (2013.01); *H01L 29/167* (2013.01); *H01L 29/36* (2013.01); *H01L 27/0255* (2013.01)

(58) Field of Classification Search
  CPC ............... H01L 21/0262; H01L 21/225; H01L 21/2251; H01L 21/324; H01L 21/823412; H01L 21/823431; H01L 21/8238; H01L 21/823807; H01L 21/823821; H01L 27/0255; H01L 27/088; H01L 27/092; H01L 29/02; H01L 29/0657; H01L 29/0665; H01L 29/0669; H01L 29/0673; H01L 29/165; H01L 29/167; H01L 29/36; H01L 29/40; H01L 29/42312; H01L 29/4232; H01L 29/42392; H01L 29/772; H01L 29/785; H01L 29/78696
  See application file for complete search history.

(56) References Cited

U.S. PATENT DOCUMENTS

2019/0058052 A1  2/2019  Frougier et al.
2019/0097000 A1  3/2019  Berry et al.

OTHER PUBLICATIONS

Song et al., "Hybrid integration of FDSOI and SI bulk for CMOS process", Proceedings In China Semiconductor Technology International Conference (CSTIC), Mar. 11-12, 2018 Shanghai, China, 3 pages.

NANOSHEET ELECTROSTATIC DISCHARGE STRUCTURE

BACKGROUND

The present invention relates generally to the field of semiconductor devices and fabrication, and more particularly to the fabrication of a electrostatic discharge (ESD) protection structure.

The use of non-planar semiconductor devices such as, for example, semiconductor fin field effect transistors (FinFETs) is the next step in the evolution of complementary metal oxide semiconductor (CMOS) devices. One type of non-planar semiconductor device that has been touted as a viable option beyond the 7 nm technology node is a nanosheet containing device. By "nanosheet containing device" it is meant that the device contains one or more layers of semiconductor channel material portions having a vertical thickness that is substantially less than its width.

Nanosheet formation relies on the selective removal of one semiconductor material (e.g., silicon) to another semiconductor material (e.g., a silicon germanium alloy) to form suspended nanosheets. Source/drain (S/D) regions for nanosheet containing devices are currently formed by epitaxial growth of a semiconductor material upwards from an exposed surface of the semiconductor substrate and from sidewalls of each nanosheet.

Extremely high voltages can develop in the vicinity of an integrated circuit due to the build-up of static charge. When the electrostatic energy is discharged, a high current is produced through devices of the integrated circuit. ESD is a serious problem for semiconductor devices, since ESD has the potential to destroy the device and the entire integrated circuit. ESD protection devices are generally integrated into the integrated circuits to protect the circuits from ESD events. An ESD protection device can provide a current path so that when an ESD transient occurs, the ESD current is conducted through the ESD protection device without going through the devices to be protected.

Diodes are needed to form ESD protection devices. In a basic example ESD protection circuitry, an input/output (I/O) pin accepts a high voltage or a high current discharge that could occur with an ESD event. In order to protect the integrated circuit from negative effects of the ESD event, a first diode discharges the excess voltage to a supply voltage. In some cases, and when a negative high voltage (or current) occurs, a second diode discharges the excess voltage to ground. A p-n diode is a type of semiconductor diode based upon the p-n junction. The diode conducts current in only one direction, and it is made by joining a p-type semiconducting layer to an n-type semiconducting layer.

SUMMARY

Embodiments of the invention include a method for fabricating a semiconductor device and the resulting structure. The method can include providing a nanosheet stack of alternating nanosheets of a sacrificial semiconductor material nanosheet and a semiconductor material nanosheet located on a surface of a semiconductor substrate, wherein a sacrificial gate structure and a dielectric spacer material layer straddle over the nanosheet stack. The method can also include recessing end portions of each of the sacrificial semiconductor material nanosheets to provide a gap between each of the semiconductor material nanosheets. The method can also include forming an additional dielectric spacer material layer within each gap. The method can also include forming a plurality of doped semiconductor portions by epitaxial growth of at least one semiconductor material on the physically exposed sidewalls of each semiconductor material nanosheet, wherein the plurality of doped semiconductor portions are present on the surface of the semiconductor substrate. The method can also include thermally annealing the semiconductor structure such that a dopant to diffuses into at least a first portion of the semiconductor material nanosheets. The method can also include removing (i) the sacrificial gate structure, (ii) each sacrificial semiconductor material nanosheet, and (iii) the dielectric spacer material layer. The method can also include forming a doped epitaxial material structure by epitaxial growth of a semiconductor material in regions occupied by each sacrificial semiconductor material nanosheet, wherein the doped epitaxial material structure wraps around each suspended semiconductor material nanosheet.

DETAILED DESCRIPTION

Figure 1:
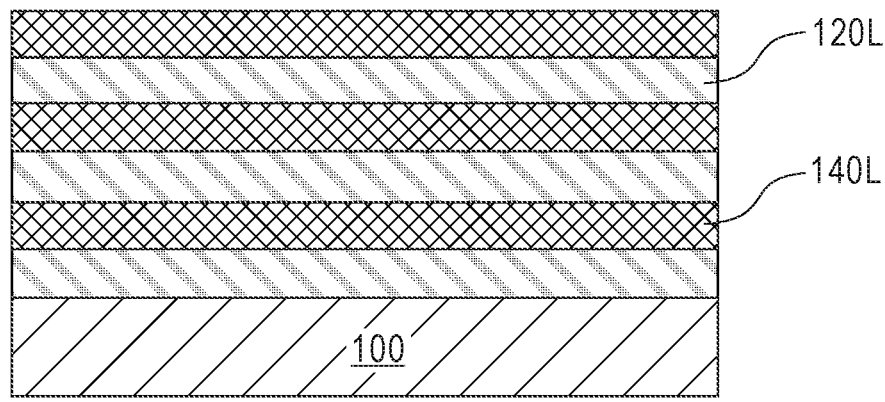
FIG. 1 depicts a semiconductor substrate and semiconductor material stack upon which embodiments of the invention can be fabricated, in accordance with an embodiment of the invention.

Embodiments of the present invention recognize that future device nodes, including 5 nanometer (nm) device scaling in transistor design may utilize nanosheets. Embodiments of the present invention describe a structure and method to form electrostatic discharge (ESD) diodes in the complementary metal oxide semiconductor (CMOS) logic device structure with slight deviations from the standard process integration. Embodiments of the present invention describe removing a dummy gate and spacers from a diode area and filling the gap with an epitaxial layer, resulting in a diode effective cross section height that is equal to the nanosheet stack height plus the height of the source/drain epitaxy in the diode area.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present invention will now be described in detail with reference to the Figures.

FIG. 1 depicts a cross-sectional view of a device at an early stage in the method of forming the device. The semiconductor structure of FIG. 1 includes a semiconductor material stack of alternating layers of sacrificial semiconductor material layer 120L and semiconductor channel material layer 140L on a surface of semiconductor substrate 100. Semiconductor substrate 100 may be composed of a silicon containing material. Silicon containing materials include, but are not limited to, silicon, single crystal silicon, polycrystalline silicon, SiGe, single crystal SiGe, polycrystalline SiGe, or silicon doped with carbon (Si:C), amorphous silicon, and combinations and multi-layers thereof. Semiconductor substrate 100 can also be composed of other semiconductor materials, such as germanium (Ge), and compound semiconductor substrates, such as type III/V semiconductor substrates, e.g., gallium arsenide (GaAs). In general, semiconductor substrate 100 is a smooth surface substrate.

Semiconductor material stack (120L, 140L) is formed upon semiconductor substrate 100. The semiconductor material stack (120L, 140L) includes sacrificial semiconductor material layers 120L and semiconductor channel material layers 140L which alternate one atop the other. In FIG. 1, and by way of one example, semiconductor material stack (120L, 140L) includes three sacrificial semiconductor material layers 120L and three semiconductor channel material layers 140L. The semiconductor material stack that can be employed is not limited to the specific embodiment illustrated in FIG. 1. Instead, the semiconductor material stack can include any number of sacrificial semiconductor material layers 120L and corresponding semiconductor channel material layers 140L.

Each sacrificial semiconductor material layer 120L is composed of a first semiconductor material which differs in composition from at least an upper portion of semiconductor substrate 100. In one embodiment, the upper portion of the semiconductor substrate 100 is composed of silicon, while each sacrificial semiconductor material layer 120 is composed of a silicon germanium alloy. In such an embodiment, the silicon germanium alloy content of sacrificial semiconductor material layer 120L may have a germanium content that is less than 50 atomic percent germanium. In one example, the SiGe alloy that makes up sacrificial semiconductor material layer 120L has a germanium content from 20 atomic percent germanium to 40 atomic percent germanium. The first semiconductor material that provides each sacrificial semiconductor material layer 120L can be formed utilizing an epitaxial growth (or deposition process) as defined in greater detail herein below.

Each semiconductor channel material layer 140L is composed of a second semiconductor material that has a different etch rate than the first semiconductor material that provides the sacrificial semiconductor material layers 120L. The second semiconductor material that provides each semiconductor channel material layer 140L may be the same as, or different from, the semiconductor material that provides at least the upper portion of the semiconductor substrate 100. In one example, at least the upper portion of the semiconductor substrate 10 and each semiconductor channel material layer 140L is composed of Si or a III-V compound semiconductor, while each sacrificial semiconductor material layer 120L is composed of a silicon germanium alloy. The second semiconductor material that provides each semiconductor channel material layer 140L can be formed utilizing an epitaxial growth (or deposition process) as defined in greater detail herein below.

Semiconductor material stack (120L, 140L) can be formed by sequential epitaxial growth of alternating layers of the first semiconductor material and the second semiconductor material. Following epitaxial growth of the topmost layer of the semiconductor material stack (120L, 140L) a patterning process may be used to provide the semiconductor material stack (120L, 140L) shown in FIG. 1. Patterning may be achieved by lithography and etching as is well known to those skilled in the art.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth the first and second semiconductor materials that provide the sacrificial semiconductor material layers and the semiconductor channel material layers, respectively, can be performed utilizing any well-known precursor gas or gas mixture. Carrier gases like hydrogen, nitrogen, helium and argon can be used.

The sacrificial semiconductor material layers 120L may have a thickness from 5 nm to 12 nm, while the semiconductor channel material layers 140L may have a thickness from 6 nm to 12 nm. Each sacrificial semiconductor material layer 120L may have a thickness that is the same as, or different from, a thickness of each semiconductor channel material layer 140L. In an embodiment, each sacrificial semiconductor material layer 120L has an identical thickness. In an embodiment, each semiconductor channel material layer 140L has an identical thickness.

Figure 2:
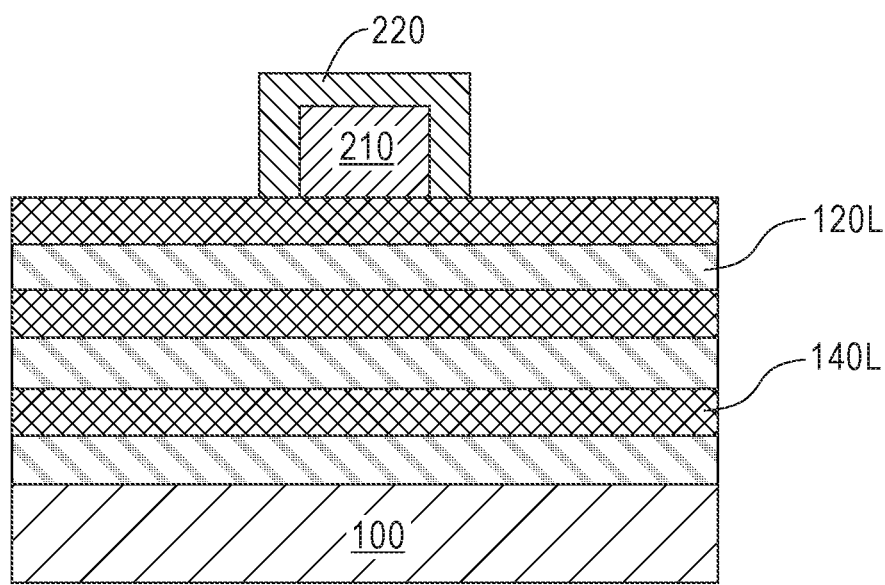
FIG. 2 depicts a process of forming a dummy gate and gate spacer upon the semiconductor material stack, in accordance with an embodiment of the invention.

FIG. 2 depicts a cross-sectional view of fabrication steps, in accordance with an embodiment of the present invention. FIG. 2 shows the formation of a sacrificial gate structure 210 and dielectric spacer material layer 220. By way of illustration, one sacrificial gate structure 210 is depicted in the drawings of the present application. Sacrificial gate structure 210 spans across a topmost surface of a portion of the semiconductor material stack (120L, 140L). Sacrificial gate structure 210 thus straddles over a portion of the semiconductor material stack (120L, 140L). The dielectric spacer material layer 220 is present on sidewalls and a topmost surface of each sacrificial gate structure 210; the dielectric spacer material layer 220 thus also straddles over the semiconductor material stack (120L, 140L).

It is noted that in the drawings, the sacrificial gate structures 210 and dielectric spacer material layer 220 are only shown as being present atop, not along sidewalls, of the semiconductor material stack (120L, 140L). This was done for clarity and to illustrate the nanosheet stack that will be subsequently formed beneath the sacrificial gate structure 210 and the dielectric spacer material layer 220.

Each sacrificial gate structure 210 may include a single sacrificial material portion or a stack of two or more sacrificial material portions (i.e., at least one sacrificial material portion). In one embodiment, the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, oxynitride, and/or amorphous carbon. In some embodiments, a multilayered dielectric structure comprising different dielectric materials can be formed and used as the sacrificial gate portion. The sacrificial gate portion may, in general, be composed of any material that can be etched selectively to the semiconductor material stack (120L, 140L). In one embodiment, the sacrificial gate portion may be composed of a silicon-inducing material, such as polysilicon. In some embodiments, the sacrificial gate portion may be composed of amorphous silicon, hydrogen silsesquioxane (HSQ), silicon oxide ($SiO_2$), hafnium oxide ($HfO_2$), or a combination thereof. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition (ALD).

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition (CVD) or plasma enhanced chemical vapor deposition (PECVD).

After providing the above mentioned sacrificial material stack (or any subset of the sacrificial materials), lithography and etching can be used to pattern the sacrificial material stack (or any subset of the sacrificial materials) and to provide the at least one sacrificial gate structure 210. The remaining portions of the sacrificial gate dielectric material constitute a sacrificial gate dielectric portion, the remaining portions of the sacrificial gate material constitute a sacrificial gate portion, and the remaining portions of the sacrificial dielectric cap material constitute a sacrificial dielectric cap portion.

After providing the sacrificial gate structure 210, the dielectric spacer material layer 220 can be formed on exposed surfaces of the sacrificial gate structure 210. The dielectric spacer material layer 220 can be formed by first providing a dielectric spacer material and then etching the dielectric spacer material. One example of a dielectric spacer material that may be employed in the present application is silicon nitride. In general, the dielectric spacer material layer 220 comprises any dielectric spacer material, including, for example, a dielectric nitride, dielectric oxide, and/or dielectric oxynitride. More specifically, the dielectric spacer material layer 220 may be, for example, SiBCN, SiBN, SiOCN, SiON, SiCO, or SiC. In one example, the dielectric spacer material is composed of a non-conductive low capacitance dielectric material such as $SiO_2$.

The dielectric spacer material that provides the dielectric spacer material layer 220 may be provided by a deposition process including, for example, chemical vapor deposition (CVD), plasma enhanced chemical vapor deposition (PECVD), or physical vapor deposition (PVD). The etch used to provide the dielectric spacer material layer 220 may comprise a dry etching process such as, for example, reactive ion etching.

Figure 3:
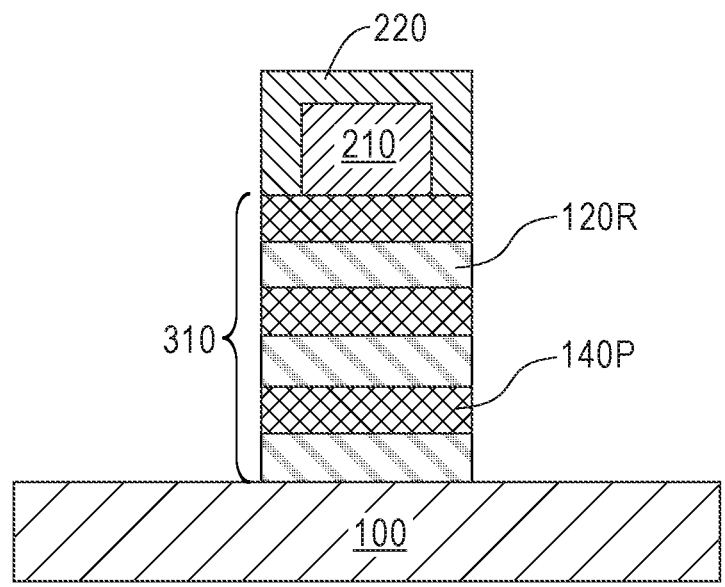
FIG. 3 depicts a process of forming a recess within the semiconductor material stack, in accordance with an embodiment of the invention.

FIG. 3 depicts a cross-sectional view of fabrication steps, in accordance with an embodiment of the present invention. FIG. 3 shows the formation of recesses within the semiconductor material stack and the formation of a nanosheet stack of alternating nanosheets of sacrificial semiconductor material layers 120L and semiconductor channel material layers 140L that are under at least one sacrificial gate structure 210 and dielectric spacer material layer 220.

The nanosheet stack 310 is formed by removing physically exposed portions of the semiconductor stack (120L, 140L) that are not protected by the least one sacrificial gate structure 210 and the dielectric spacer material layer 220.

The removing of the portions of the semiconductor material stack (120L, 140L) not covered by the least one sacrificial gate structure 210 and the dielectric spacer material layer 220 can be performed utilizing an anisotropic etching process such as, for example, reactive ion etching (ME). Portions of the semiconductor material stack (120L, 140L) remain beneath the at least one sacrificial gate structure 210 and the dielectric spacer material layer 220. The remaining portion of the semiconductor material stack that is presented beneath the at least one sacrificial gate structure 210 and the dielectric spacer material layer 220 is referred to as nanosheet stack 310.

Nanosheet stack 310 includes alternating nanosheets of remaining portions of each sacrificial semiconductor material layer (referred to herein as sacrificial semiconductor material nanosheet 120P) and remaining portions of each semiconductor channel material layer (referred to herein as semiconductor channel material nanosheet 140P).

Each nanosheet, i.e., sacrificial semiconductor material nanosheet 120P and semiconductor channel material nanosheet 140P, that constitutes the nanosheet stack 310 has a thickness as mentioned above for the individual sacrificial semiconductor material layers 120L and semiconductor channel material layers 140L, and a width from 30 nm to 200 nm. In some embodiments, as illustrated in FIG. 3, the sidewalls of each sacrificial semiconductor material nanosheet 120P are vertically aligned to sidewalls of each semiconductor channel material nanosheet 140P, and the vertically aligned sidewalls of the nanosheet stack 310 are vertically aligned to an outmost sidewall of dielectric spacer material layer 220.

Figure 4:
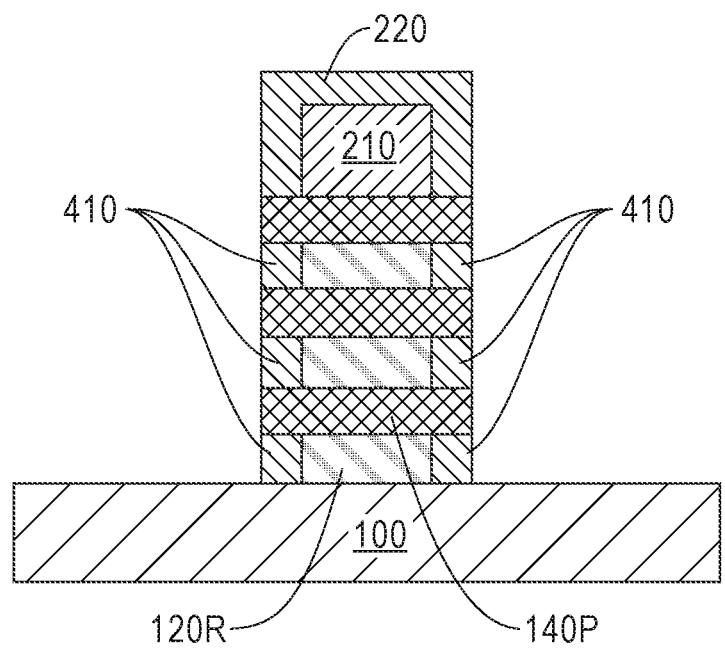
FIG. 4 depicts a process of recessing a sacrificial semiconductor material layer and forming inner dielectric spacers, in accordance with an embodiment of the invention.

FIG. 4 depicts a cross-sectional view of fabrication steps, in accordance with an embodiment of the present invention. FIG. 4 depicts the recessing of each sacrificial semiconductor material nanosheet 120P to provide recessed sacrificial semiconductor material nanosheets 120R and the forming of an inner dielectric spacer 410 on exposed sidewalls of each recessed sacrificial semiconductor material nanosheet 120R.

Each recessed sacrificial semiconductor material nanosheet 120R has a width that is less than the original width of each sacrificial semiconductor material nanosheet 120P. The recessing of each sacrificial semiconductor material nanosheet 120P provides a gap (not specifically shown) between each neighboring pair of semiconductor channel material nanosheets 140P within a given nanosheet stack 310. The recessing of each sacrificial semiconductor material nanosheet 120P may be performed utilizing a lateral etching process that is selective in removing physically exposed end portions of each sacrificial semiconductor material nanosheet 120P relative to each semiconductor channel material nanosheet 140P.

The inner dielectric spacer 410 is then formed within the gaps by depositing an inner dielectric spacer material and etching the deposited inner dielectric spacer material. In one example, the inner dielectric spacer material is composed of silicon nitride. As is shown, the inner dielectric spacer 410 that is formed in the gaps between each neighboring pair of vertically stacked semiconductor channel material nanosheets 140P directly contacts a sidewall of one of the recessed sacrificial semiconductor material nanosheets 120R. The inner dielectric spacer 410 that is formed in the gap between each neighboring pair of vertically stacked semiconductor channel material nanosheets 140P has an outermost sidewall that is vertically aligned to the outermost sidewall of each semiconductor channel material nanosheet 140P.

FIGS. 5-11 depict embodiments of the present invention that include source/drain regions (510, 520) with opposite doping polarities (i.e., one source/drain has p-type dopants and the other source/drain region has n-type dopants).

Figure 5:
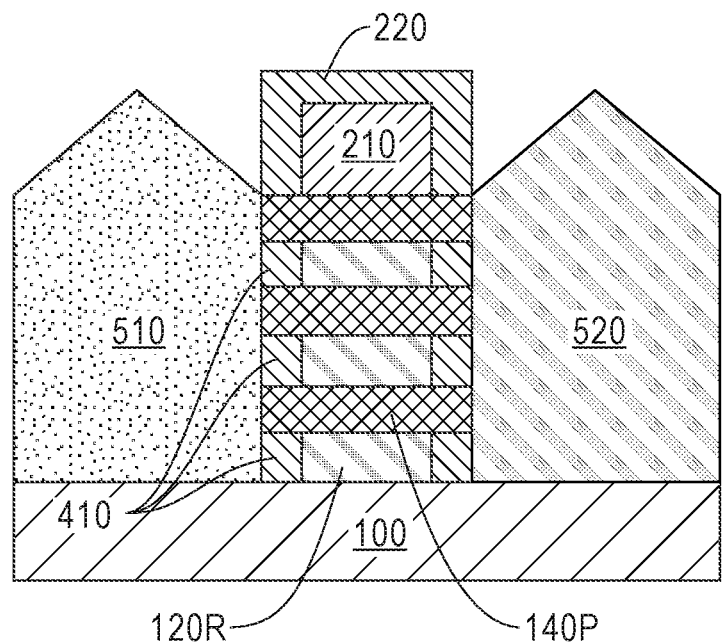
FIG. 5 depicts the formation of doped source/drain regions, in accordance with an embodiment of the invention.

FIG. 5 depicts a cross-sectional view of fabrication steps in accordance with an embodiment of the present invention. FIG. 5 depicts the formation of source/drain region 510 and source/drain region 520 on semiconductor substrate 100 and along the sidewalls of nanosheet stack 310.

Each source/drain region (510, 520) includes a semiconductor material and a dopant. The semiconductor material that provides each source/drain region (510, 520) can be selected from any semiconductor material that has semiconducting properties. The semiconductor material that provides source/drain region 510 comprises a different semiconductor material than the semiconductor material that provides source/drain region 520. The semiconductor material that provides each source/drain region (510, 520) may be either the same, or different, than sacrificial semiconductor material layer 120L (and thus each recessed sacrificial semiconductor material nanosheet 120R) and semiconductor channel material layer 140L (and thus each semiconductor channel material nanosheet 140P), provided that source/drain region 510 comprises a different semiconductor material than the semiconductor material that provides source/drain region 520. In one embodiment, the semiconductor material that provides source/drain region 510 is silicon and that semiconductor material that provides source/drain region 520 is a silicon germanium alloy.

Each source/drain region (510, 520) is formed by epitaxial growth of a semiconductor material on physically exposed sidewalls of each semiconductor channel material nanosheet 140P. In the present application, the semiconductor material that provides each source/drain region (510, 520) grows laterally out from the sidewalls of each semiconductor channel material nanosheet 140P. Each source/drain region (510, 520) has a bottommost surface that directly contacts a topmost surface of semiconductor substrate 100. In some embodiments, each source/drain region (510, 520) has a faceted upper surface.

As source/drain region 510 comprises a different semiconductor material than the semiconductor material that provides source/drain region 520, masking material (not shown) may be applied to coordinate the desired growth of source/drain region 510 and source/drain region 520. For example, prior to the formation of source/drain region 510, masking material (not shown) may be applied to the top of silicon substrate 100 and exposed sidewalls of semiconductor channel material nanosheet 140P in the region occupied by source/drain region 520. Subsequent to the formation of source/drain region 510, an etching process may be utilized to remove said masking material, and additional masking material (not shown) may be applied to exposed surfaces of source/drain region 510 and source/drain region 510 may be formed. In some embodiments, the described masking material may be a photoresist which has been patterned using photolithography.

The dopant that is present in each source/drain region (510, 520) can be either a p-type dopant or an n-type dopant. Each source/drain region (510, 520) is a different type (i.e., one source/drain region is a p-type dopant and the other source/drain region is an n-type dopant). In one embodiment, source/drain region 510 is a p-type dopant and source/drain region 520 is an n-type dopant.

The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. Doping concentrations can be tuned to meet the diode fabrication and design requirements. In some embodiments, doping concentrations in the respective source/drain region (510 or 520) doped with an n-type dopant include 4e20 atoms/cm$^3$ to 1.5e21 atoms/cm$^3$. In some embodiments, doping concentrations in the respective source/drain region (510 or 520) doped with a p-type dopant include 4e20 atoms/cm$^3$ to 1.5e21 atoms/cm$^3$. As described above, in embodiments of the present invention, source/drain region 510 has a different doping type than source/drain region 520 (e.g., (i) source/drain region 510 is a p-type dopant and source/drain region 520 is an n-type dopant or (ii) vice versa).

In one embodiment, the dopant that can be present in the each source/drain region (510, 520) can be introduced into the precursor gas that provides each source/drain region (510, 520). In another embodiment, the dopant can be introduced into an intrinsic semiconductor layer by utilizing one of ion implantation or gas phase doping. In one embodiment, source/drain region 510 comprises silicon that is doped with a n-type dopant such as, for example, phosphorus and source/drain region 520 comprises a silicon germanium alloy that is doped with a p-type dopant such as, for example, boron. As mentioned above, each source/drain region (510, 520) is formed by an epitaxial growth (or deposition) process, as is defined above.

In an embodiment, a thermal annealing process is used to anneal the junction of the current device by inducing a high temperature to the current device in order to allow the dopants to diffuse partly into the channel (i.e., semiconductor channel material nanosheet 140P). A thermal anneal process such as laser anneal, flash anneal, rapid thermal anneal (RTA), furnace anneal, or any suitable combination of those annealing techniques can be performed.

Figure 6:
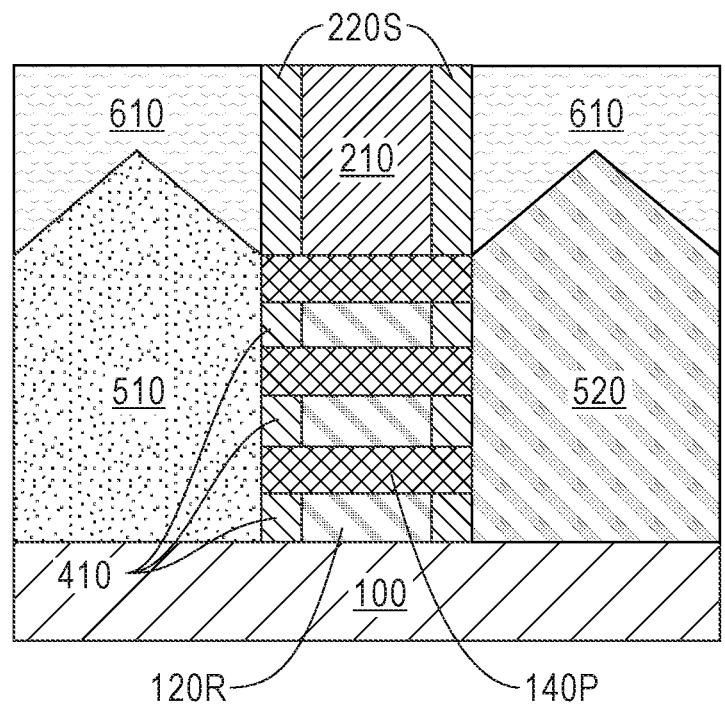
FIG. 6 depicts the formation of interlevel dielectric (ILD) material, in accordance with an embodiment of the invention.

FIG. 6 depicts a cross-sectional view of fabrication steps, in accordance with an embodiment of the present invention. FIG. 6 depicts the formation of interlevel dielectric (ILD) material 610 and planarization to expose the top surface of sacrificial gate structure 210.

The ILD material 610 is formed above each source/drain region (510, 520). ILD material 610 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material 610. The use of a self-planarizing dielectric material as ILD material 610 may avoid the need to perform a subsequent planarizing step.

In one embodiment, ILD material 610 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD material 610, a planarization process or an etch back process follows the deposition of the dielectric material that provides ILD material 610. As is shown in FIG. 6, ILD material 610 that is present atop each source/drain region (510, 520) has a topmost surface that is coplanar with a topmost surface of the dielectric spacers 220S and sacrificial gate structure 210.

After providing ILD material 610, a horizontal portion of dielectric gate spacer material layer 220 is removed from atop each sacrificial gate structure 210, creating the depicted dielectric spacers 220S. The removal of the horizontal portion of dielectric gate spacer material layer 210 that is above each sacrificial gate structure 210 can be performed utilizing one or more anisotropic etching processes.

Figure 7:
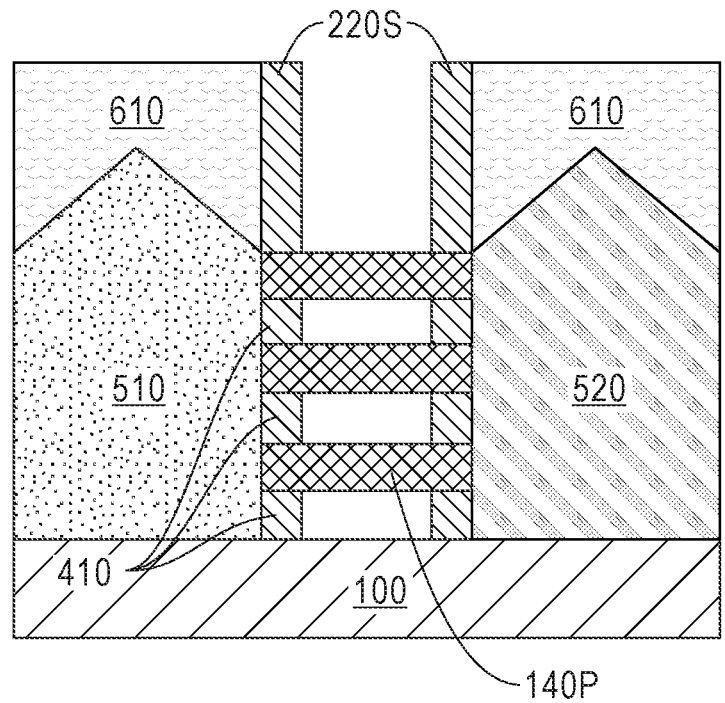
FIG. 7 depicts the removal of the dummy gate and sacrificial semiconductor material nanosheets, in accordance with an embodiment of the invention.

FIG. 7 depicts a cross-sectional view of fabrication steps, in accordance with an embodiment of the present invention. FIG. 7 depicts the removal of sacrificial gate structure 210 and each recessed sacrificial semiconductor material nanosheet 120R.

Sacrificial gate structure 210 is removed to provide a cavity. The removal of the sacrificial gate structure 210 can be performed utilizing one or more anisotropic etching processes.

Next, each semiconductor channel material nanosheet 140P is suspended by selectively etching each recessed sacrificial semiconductor material nanosheet 120R relative to each semiconductor channel material nanosheet 140P to create gaps. Methods to remove each recessed sacrificial semiconductor material nanosheet 120R include gas phase hydrofluoric acid and a wet etch process with an etchant containing ammonia and hydrogen peroxide. Left behind during the etching process is semiconductor channel material nanosheet 140P. Such a process removes each recessed sacrificial semiconductor material nanosheet 120R while retaining the source/drain regions (510, 520) and each semiconductor channel material nanosheet 140P.

Figure 8:
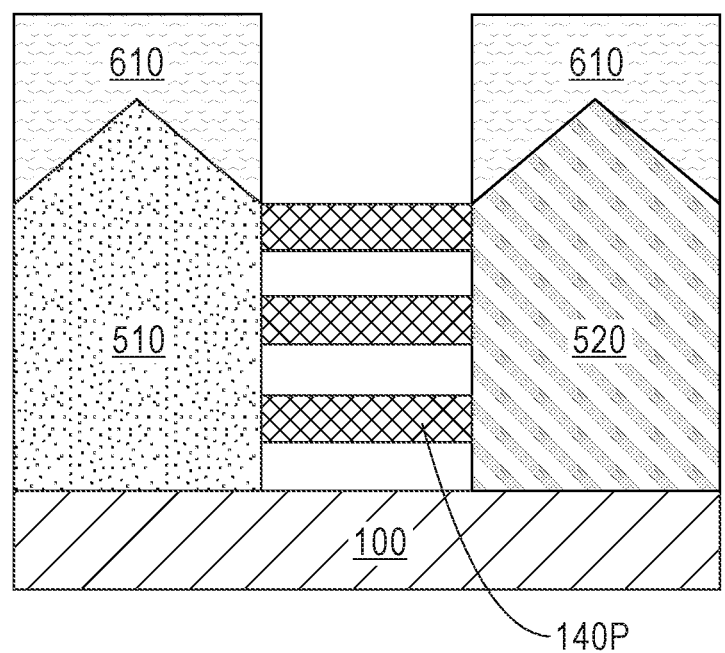
FIG. 8 depicts the removal of the dielectric spacers, in accordance with an embodiment of the invention.

FIG. 8 depicts a cross-sectional view of fabrication steps, in accordance with an embodiment of the present invention. FIG. 8 depicts the removal of dielectric spacers 220S and each inner dielectric spacer 410.

The removal of dielectric spacers 220S and each inner dielectric spacer 410 can be performed utilizing one or more anisotropic etching processes known by one of ordinary skill in the art.

Figure 9A:
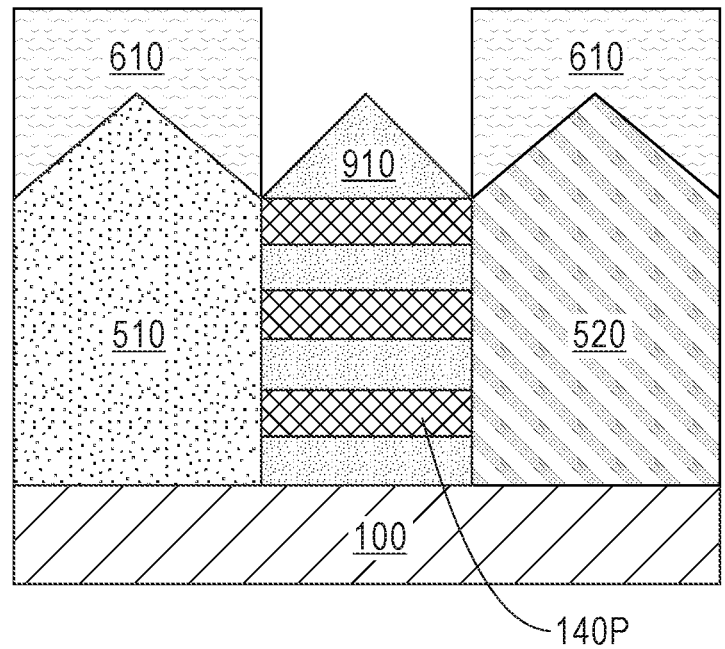
FIG. 9A depicts a first view, intersecting the semiconductor channel material nanosheet, of the formation of a doped epitaxial material, in accordance with an embodiment of the present invention.
Figure 9B:
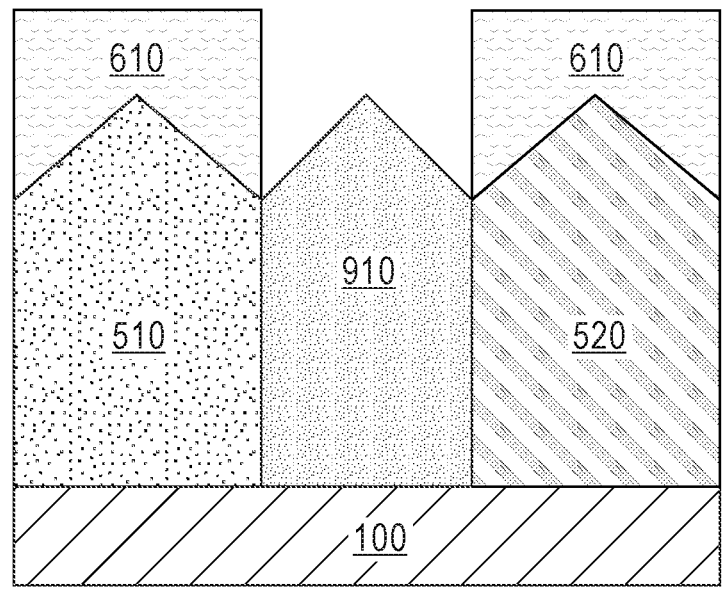
FIG. 9B depicts a second view, that does not intersect the semiconductor channel material nanosheet, of the formation of a doped epitaxial material, in accordance with an embodiment of the present invention.

FIG. 9A depicts a first cross-sectional view and FIG. 9B depicts a second cross-sectional view of fabrication steps, in accordance with an embodiment of the present invention. More particularly, the cross-sectional view depicted by FIG. 9A intersects with each semiconductor channel material nanosheet 140P of nanosheet stack 310. The cross-sectional view depicted by FIG. 9B does not intersect with the semiconductor channel material nanosheets 140P of nanosheet stack 310 and, therefore, no semiconductor channel material nanosheet is visible. FIGS. 9A and 9B depict the formation of epitaxial material 910.

Epitaxial material 910 is formed within the cavity between each source/drain region (510/520) by epitaxially growing (or depositing) a material that has either n-type dopants or p-type dopants. Doping concentrations can be tuned to meet the diode fabrication and design requirements. In some embodiments, when epitaxial material 910 has n-type dopants, doping concentrations in epitaxial material 910 include 1e19 atoms/cm$^3$ to 4e20 atoms/cm$^3$. In some embodiments, when epitaxial material 910 has p-type dopants, doping concentrations in epitaxial material 910 include 1e17 atoms/cm$^3$ to 1e19 atoms/cm$^3$. The epitaxial material 910 can include silicon, silicon germanium, germanium, carbon-doped silicon, carbon-doped silicon germanium, etc. In some embodiments, epitaxial material 910 has a faceted upper surface.

Figure 10:
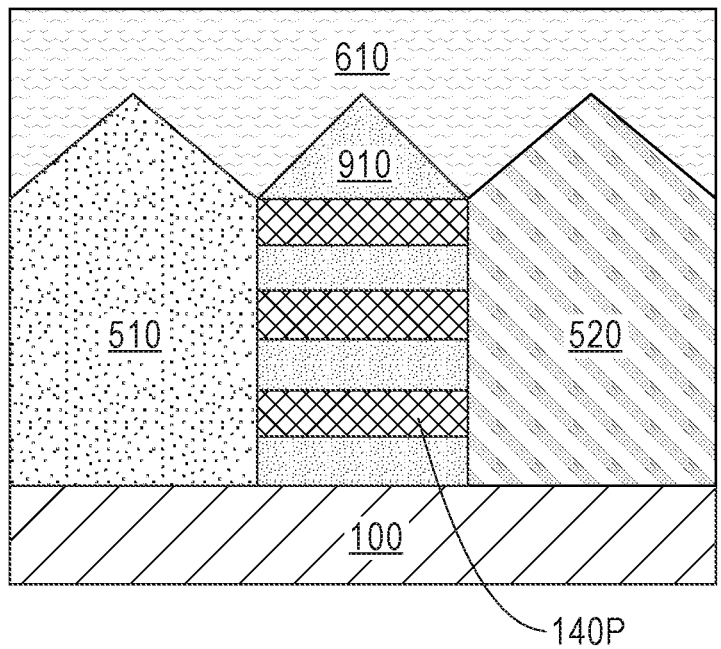
FIG. 10 depicts the formation of ILD material, in accordance with an embodiment of the present invention.

FIG. 10 depicts a cross-sectional view of fabrication steps, in accordance with an embodiment of the present invention. FIG. 10 depicts the formation of additional ILD material 610.

The additional ILD material 610 is formed above the nanosheet stack, and therefore is above epitaxial material 910 and semiconductor channel material nanosheet 140P. As described above, ILD material 610 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. In another embodiment, a self-planarizing material such as a spin-on glass (SOG) or a spin-on low-k dielectric material such as SiLK™ can be used as ILD material 610.

In one embodiment, ILD material 610 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD material 610, a planarization process or an etch back process follows the deposition of the dielectric material that provides ILD material 610. As is shown in FIG. 10, ILD material 610 is present atop each source/drain region (510, 520) and nanosheet stack 310.

A thermal annealing process is used to drive dopant into each semiconductor channel material nanosheet 140P. As described above, a thermal anneal process such as laser anneal, flash anneal, rapid thermal anneal (RTA), furnace anneal, or any suitable combination of those annealing techniques can be performed.

Figure 11:
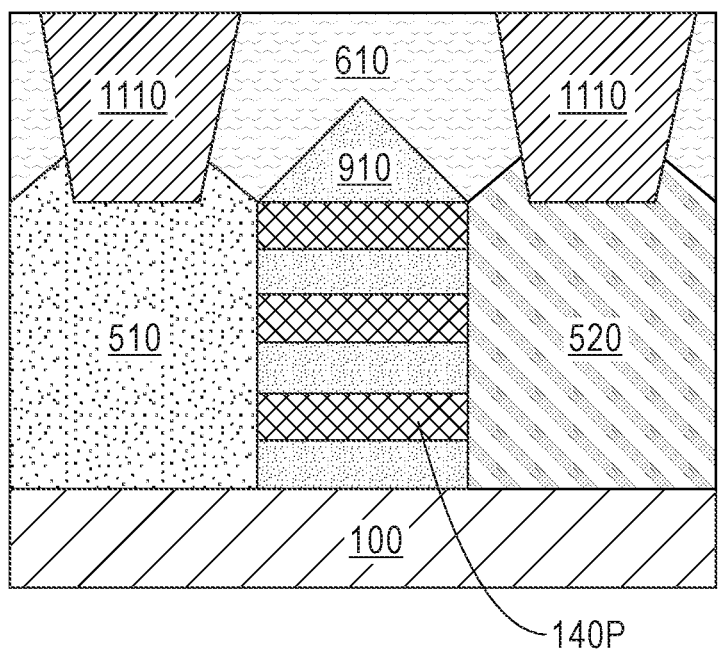
FIG. 11 depicts the formation of contacts, in accordance with an embodiment of the present invention.

FIG. 11 depicts a cross-sectional view of fabrication steps, in accordance with an embodiment of the present invention. FIG. 11 depicts the formation of contacts 1110.

Nonlimiting methods for forming contacts 1110 include depositing a dielectric material, patterning to form contact trenches, and filling the trenches with a conducting material. FIG. 11 depicts forming a first contact and a second contact, that collectively are described as contacts 1110. The first contact extends downward from the surface of the structure to the source/drain region 510. The second contact extends downward from the surface of the structure to the source/drain region 520.

As illustrated in FIG. 11, an ESD protection structure is thus formed. The depicted ESD protection structure includes a plurality of stacked and suspended doped semiconductor channel material nanosheets 140P located above semiconductor substrate 100. An epitaxial material 910 is located surrounding each semiconductor channel material nanosheet 140P of the plurality of stacked and suspended semiconductor channel material nanosheets 140P. Source/drain regions (510, 520) are located on each side of the nanosheet stack 310 and are physically contacting sidewalls of epitaxial material 910 and each semiconductor channel material nanosheet 140P of the plurality of stacked and suspended semiconductor channel material nanosheets 140P. Source/drain region 510 has a conductivity type opposite from the conductivity type of source/drain region 520. In some embodiments, epitaxial material 910 is n-doped. In some embodiments, epitaxial material 910 is p-doped. ILD material 610 is located above each source/drain region (510, 520) and above the nanosheet stack 310, with the exception of the areas that include contacts 1110. Contacts 1110 are formed in trenches that extend downward from the surface of the structure to individually make contact with each of the source/drain regions (510, 520). A semiconductor substrate 100 is beneath the nanosheet stack 310 and source/drain regions 520. The contacts 1110 provide electrical connections to various components of the ESD protection structure (140P, 510, 520, 910).

FIGS. 12-17 depict embodiments of the present invention that include multiple source/drain regions 1210 with the same doping polarities (i.e., (i) both source/drain regions 1210 have p-type dopants or (ii) both source/drain regions have n-type dopants).

Figure 12:
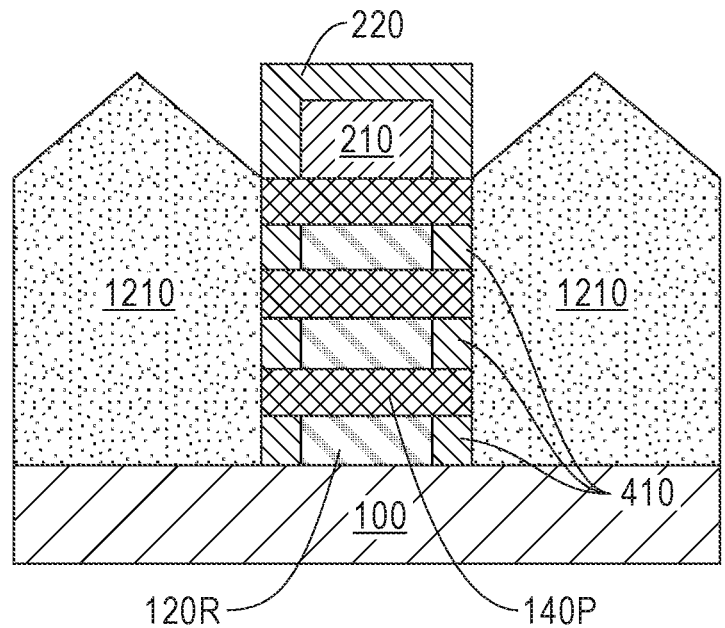
FIG. 12 depicts the formation of doped source/drain regions, in accordance with an embodiment of the invention.

FIG. 12 depicts a cross-sectional view of fabrication steps in accordance with an embodiment of the present invention. FIG. 12 depicts the formation of source/drain regions 1210 on semiconductor substrate 100 and along the sidewalls of nanosheet stack 310.

Each source/drain region 1210 includes a semiconductor material and a dopant. The semiconductor material that provides each source/drain region 1210 can be selected from any semiconductor material that has semiconducting properties. The semiconductor material that provides each of the source/drain regions 1210 is the same semiconductor material. The semiconductor material that provides each source/drain region 1210 may be either the same, or different, than sacrificial semiconductor material layer 120L (and thus each recessed sacrificial semiconductor material nanosheet 120R) and semiconductor channel material layer 140L (and thus each semiconductor channel material nanosheet 140P), provided that the source/drain regions 1210 are the same semiconductor material. In one embodiment, the semiconductor material that provides each source/drain region 510 is silicon.

Each source/drain region 1210 is formed by epitaxial growth of a semiconductor material on physically exposed sidewalls of each semiconductor channel material nanosheet 140P. In the present application, the semiconductor material that provides each source/drain region 1210 grows laterally out from the sidewalls of each semiconductor channel material nanosheet 140P. Each source/drain region 1210 has a bottommost surface that directly contacts a topmost surface of semiconductor substrate 100. In some embodiments, each source/drain region 1210 has a faceted upper surface.

The dopant that is present in each source/drain region 1210 can be either a p-type dopant or an n-type dopant. Each source/drain region 1210 has the same doping polarity (i.e., (i) both source/drain regions 1210 have p-type dopants or (ii) both source/drain regions have n-type dopants). In one embodiment, source/drain regions 1210 are n-type dopants.

As described above, the term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. Doping concentrations can be tuned to meet the diode fabrication and design requirements. In some embodiments, doping concentrations in the source/drain regions 1210 doped with an n-type dopant include 4e20 atoms/cm$^3$ to 1.5e21 atoms/cm$^3$. In some embodiments, doping concentrations in the source/drain regions 1210 doped with a p-type dopant include 4e20 atoms/cm$^3$ to 1.5e21 atoms/cm$^3$.

In one embodiment, the dopant that can be present in the each source/drain region 1210 can be introduced into the precursor gas that provides each source/drain region 1210. In another embodiment, the dopant can be introduced into an intrinsic semiconductor layer by utilizing one of ion implantation or gas phase doping. In one embodiment, source/drain regions 1210 each comprises silicon that is doped with a n-type dopant such as, for example, phosphorus. In another embodiment, source/drain regions 1210 each comprise a silicon germanium alloy that is doped with a p-type dopant such as, for example, boron. As mentioned above, each source/drain region 1210 is formed by an epitaxial growth (or deposition) process, as is defined above.

A thermal annealing process is used to anneal the junction of the current device by inducing a high temperature to the current device in order to allow the dopants to diffuse partly into the channel (i.e., semiconductor channel material nanosheet 140P). Any of the thermal anneal processes described previously can be performed.

Figure 13:
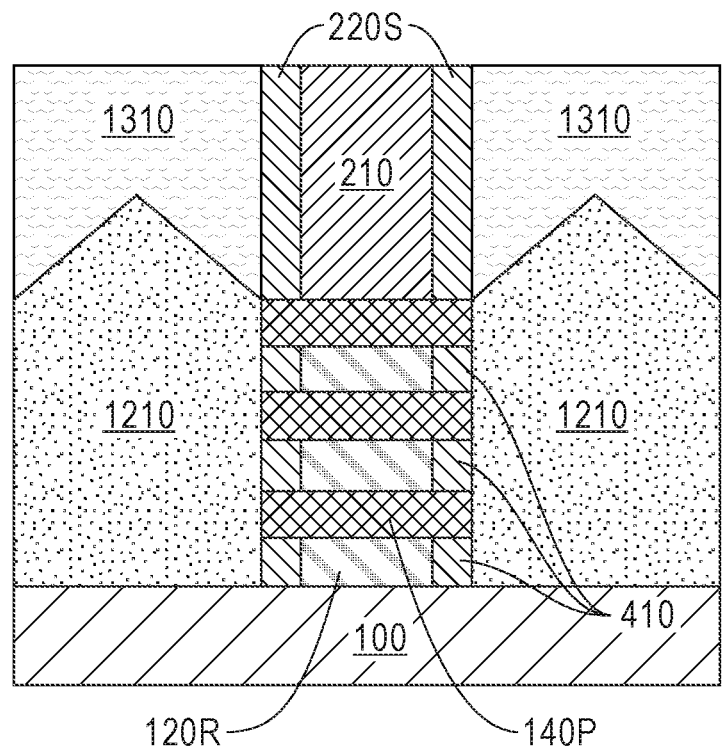
FIG. 13 depicts the formation of ILD material, in accordance with an embodiment of the invention.

FIG. 13 depicts a cross-sectional view of fabrication steps, in accordance with an embodiment of the present invention. FIG. 6 depicts the formation of interlevel dielectric (ILD) material 1310 and planarization to expose the top surface of sacrificial gate structure 210.

The ILD material 1310 is formed above each source/drain region 1210. ILD material 1310 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material 1310. The use of a self-planarizing dielectric material as ILD material 1310 may avoid the need to perform a subsequent planarizing step.

In one embodiment, ILD material 1310 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD material 1310, a planarization process or an etch back process follows the deposition of the dielectric material that provides ILD material 1310. As is shown in FIG. 13, ILD material 1310 that is present atop each source/drain region 1210 has a topmost surface that is coplanar with a topmost surface of the dielectric spacers 220S and sacrificial gate structure 210.

After providing ILD material 1310, a horizontal portion of dielectric gate spacer material layer 220 is removed from atop each sacrificial gate structure 210, creating the depicted dielectric spacers 220S. The removal of the horizontal portion of dielectric gate spacer material layer 210 that is above each sacrificial gate structure 210 can be performed utilizing one or more anisotropic etching processes.

Figure 14:
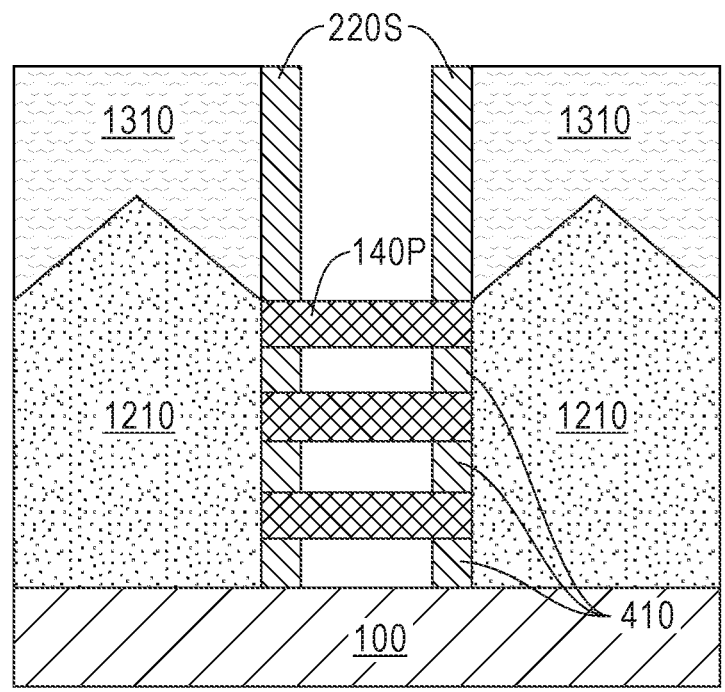
FIG. 14 depicts the removal of the dummy gate and sacrificial semiconductor material nanosheets, in accordance with an embodiment of the invention.

FIG. 14 depicts a cross-sectional view of fabrication steps, in accordance with an embodiment of the present invention. FIG. 14 depicts the removal of sacrificial gate structure 210 and each recessed sacrificial semiconductor material nanosheet 120R.

Sacrificial gate structure 210 is removed to provide a cavity. The removal of the sacrificial gate structure 210 can be performed utilizing one or more anisotropic etching processes.

Next, each semiconductor channel material nanosheet 140P is suspended by selectively etching each recessed sacrificial semiconductor material nanosheet 120R relative to each semiconductor channel material nanosheet 140P to create gaps. Methods to remove each recessed sacrificial semiconductor material nanosheet 120R include gas phase hydrofluoric acid and a wet etch process with an etchant containing ammonia and hydrogen peroxide. Left behind during the etching process is semiconductor channel material nanosheet 140P. Such a process removes each recessed sacrificial semiconductor material nanosheet 120R while retaining the source/drain regions 1210 and each semiconductor channel material nanosheet 140P.

Figure 15:
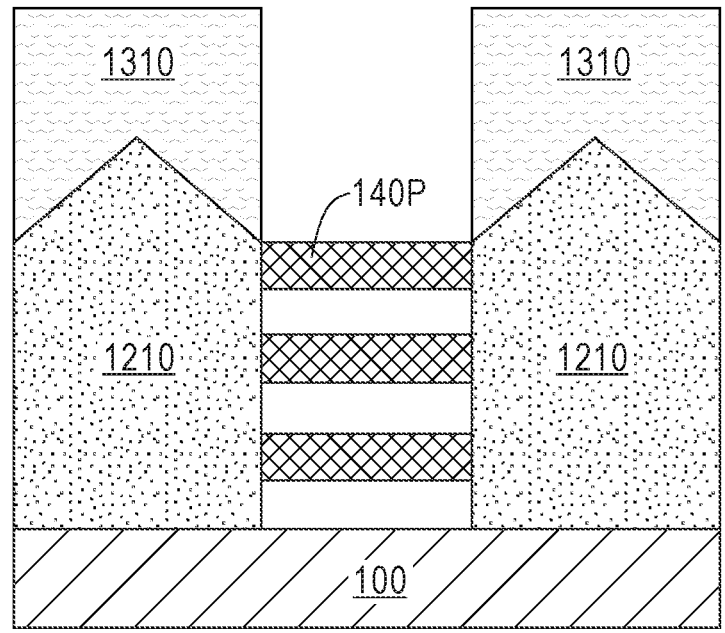
FIG. 15 depicts the removal of the dielectric spacers, in accordance with an embodiment of the invention.

FIG. 15 depicts a cross-sectional view of fabrication steps, in accordance with an embodiment of the present invention. FIG. 15 depicts the removal of dielectric spacers 220S and each inner dielectric spacer 410.

The removal of dielectric spacers 220S and each inner dielectric spacer 410 can be performed utilizing one or more anisotropic etching processes known by one of ordinary skill in the art.

Figure 16A:
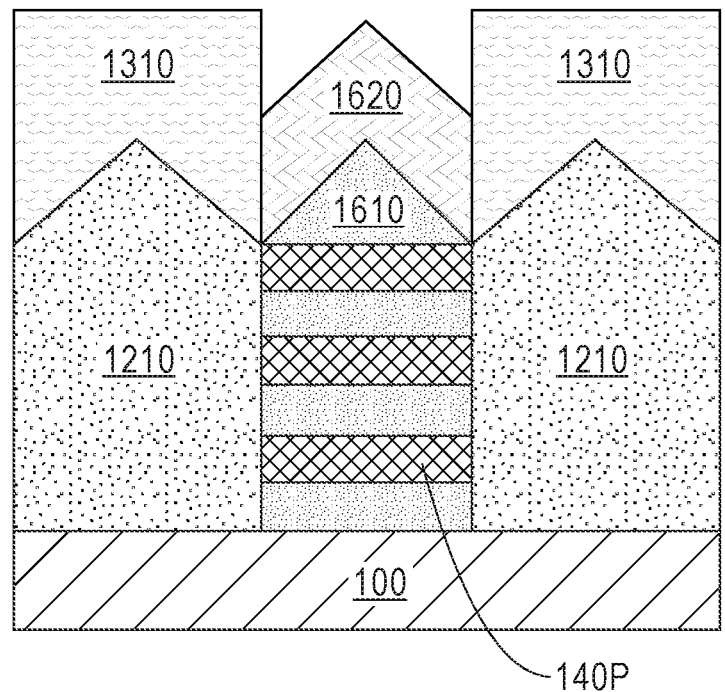
FIG. 16A depicts a first view, intersecting the semiconductor channel material nanosheet, of the formation of a doped epitaxial material and a doped epitaxial material capping layer, in accordance with an embodiment of the present invention.
Figure 16B:
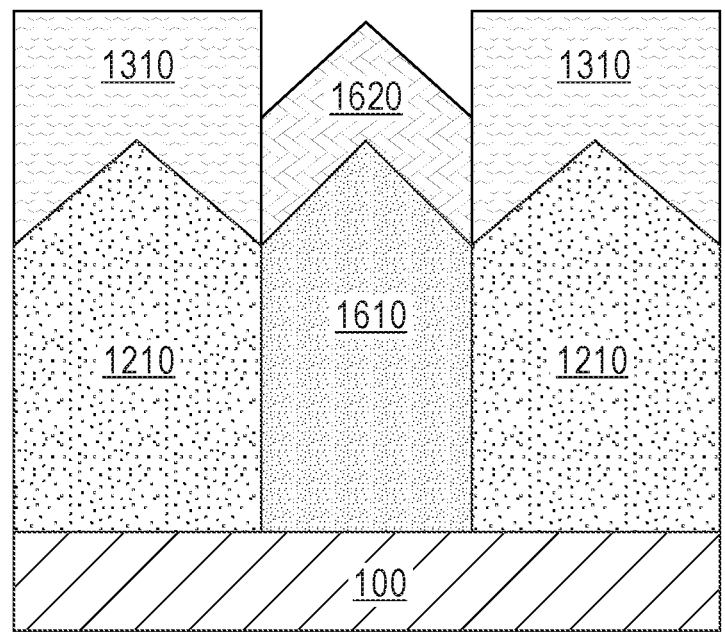
FIG. 16B depicts a second view, that does not intersect the semiconductor channel material nanosheet, of the formation of a doped epitaxial material and a doped epitaxial material capping layer, in accordance with an embodiment of the present invention.

FIG. 16A depicts a first cross-sectional view and FIG. 16B depicts a second cross-sectional view of fabrication steps, in accordance with an embodiment of the present invention. More particularly, the cross-sectional view depicted by FIG. 16A intersects with each semiconductor channel material nanosheet 140P of nanosheet stack 310. The cross-sectional view depicted by FIG. 16B does not intersect with the semiconductor channel material nanosheets 140P of nanosheet stack 310 and, therefore, no semiconductor channel material nanosheet is visible. FIGS. 16A and 16B depict the formation of epitaxial material 1610 and epitaxial material capping layer 1620.

Epitaxial material 1610 is formed within the cavity between each source/drain region 1210 by epitaxially growing (or depositing) a material that has dopant polarity opposite to the dopant polarity of each source/drain region 1210. For example, if each source/drain region 1210 comprises n-type material, epitaxial material 1610 will comprise p-type material. Doping concentrations can be tuned to meet the diode fabrication and design requirements. In some embodiments, if epitaxial material 1610 is doped with a p-type dopant, the doping concentrations include 1e17 atoms/cm$^3$ to 1e19 atoms/cm$^3$. In other embodiments, if epitaxial material 1610 is doped with an n-type dopant, the doping concentrations include 1e19 atoms/cm$^3$ to 4e20 atoms/cm$^3$. The epitaxial material 1610 can include silicon, silicon germanium, germanium, carbon-doped silicon, carbon-doped silicon germanium, etc. In one embodiment, epitaxial material 1610 is silicon germanium doped with boron. In some embodiments, epitaxial material 1610 has a faceted upper surface.

Epitaxial material capping layer 1620 is formed on epitaxial material 910 by epitaxially growing (or depositing) a material that is doped greater than epitaxial material 910. For example, if epitaxial material 1610 is silicon germanium doped with boron (doping concentrations include 1e17 atoms/cm$^3$ to 1e19 atoms/cm$^3$), epitaxial material capping layer 1620 may be silicon germanium doped with boron (doping concentrations include 4e20 atoms/cm$^3$ to 1.5e21 atoms/cm$^3$). For another example, if epitaxial material 1610 is silicon doped with phosphorus (doping concentrations include 1e19 atoms/cm$^3$ to 4e20 atoms/cm$^3$), epitaxial material capping layer 1620 may be silicon doped with phosphorus (doping concentrations include 4e20 atoms/cm$^3$ to 1.5e21 atoms/cm$^3$). The epitaxial material capping layer 1620 can include silicon, silicon germanium, germanium, carbon-doped silicon, carbon-doped silicon germanium, etc. In some embodiments, epitaxial material capping layer 1620 has a faceted upper surface.

Figure 17:
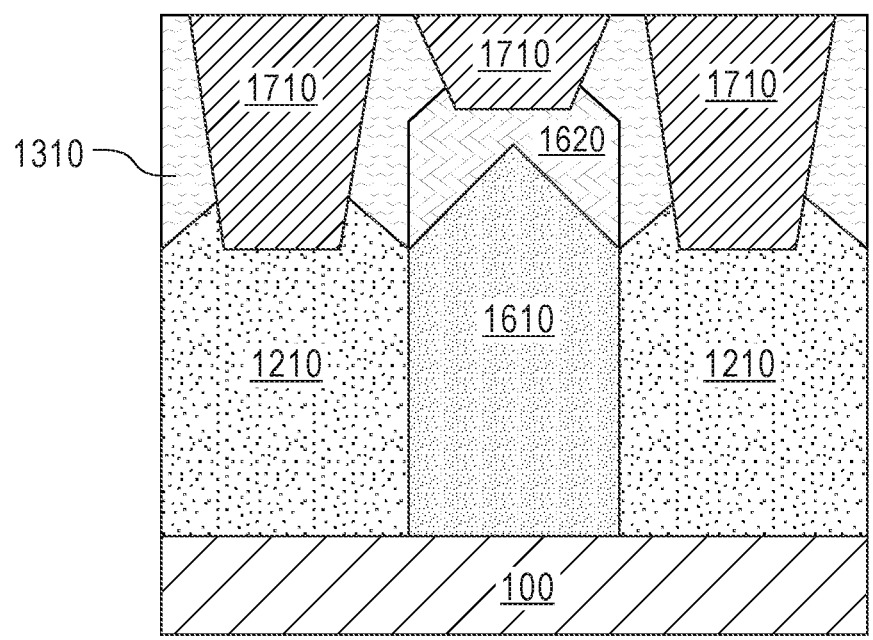
FIG. 17 depicts the formation of contacts, in accordance with an embodiment of the present invention.

FIG. 17 depicts a cross-sectional view of fabrication steps, in accordance with an embodiment of the present invention. FIG. 17, similar to FIG. 16B, is a cross-sectional view that does not intersect with the semiconductor channel material nanosheets 140P of nanosheet stack 310, and therefore, no semiconductor channel material nanosheet is visible. FIG. 17 depicts the formation of additional ILD material 1310 and the formation of contacts 1710.

Prior to the formation of the contacts 1710, additional ILD material 1310 is formed above the nanosheet stack, and therefore is above epitaxial material 1610, epitaxial material capping layer 1620, and semiconductor channel material nanosheet 140P. As described above, ILD material 1310 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. In another embodiment, a self-planarizing material such as a spin-on glass (SOG) or a spin-on low-k dielectric material such as SiLK™ can be used as ILD material 1310.

In one embodiment, ILD material 1310 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD material 1310, a planarization process or an etch back process follows the deposition of the dielectric material that provides ILD material 1310. As is shown in FIG. 17, ILD material 1310 is present atop each source/drain region 1210 and nanosheet stack 310.

Nonlimiting methods for forming contacts 1710 include depositing a dielectric material, patterning to form contact trenches, and filling the trenches with a conducting material. FIG. 17 depicts forming a first contact, a second contact, and a third contact that collectively are described as contacts 1710. The first contact extends downward from the surface of the structure to a first source/drain region 1210. The second contact extends downward from the surface of the structure to epitaxial material capping layer 1620. The third contact extends downward from the surface of the structure to a second source/drain region 1210.

As illustrated in FIGS. 16A-17, an ESD protection structure is thus formed. The depicted ESD protection structure includes a plurality of stacked and suspended doped semiconductor channel material nanosheets 140P located above semiconductor substrate 100. An epitaxial material 1610 is located surrounding each semiconductor channel material nanosheet 140P of the plurality of stacked and suspended semiconductor channel material nanosheets 140P. An epitaxial material capping layer 1620 is above epitaxial material 1610. Source/drain regions 1210 are located on each side of the nanosheet stack 310 and are physically contacting sidewalls of epitaxial material 1610 and each semiconductor channel material nanosheet 140P of the plurality of stacked and suspended semiconductor channel material nanosheets 140P. Source/drain regions 1210 each have the same conductivity type. Epitaxial material 1610 and epitaxial material capping layer 1620 each have a conductivity type opposite that of source/drain regions 1210. ILD material 1310 is located above each source/drain region 1210 and above the nanosheet stack 310, with the exception of the areas that include contacts 1710. Contacts 1710 are formed in trenches that extend downward from the surface of the structure to individually make contact with each of the source/drain regions 1210 and epitaxial material capping layer 1620. A semiconductor substrate 100 is beneath the nanosheet stack 310 and source/drain regions 1210. The contacts 1710 provide electrical connections to various components of the ESD protection structure (140P, 1210, 1610, 1620).

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a plurality of stacked and suspended semiconductor material nanosheets, of a first conductivity type, located above a semiconductor substrate;
    a doped epitaxial material structure, of the first conductivity type, surrounding each semiconductor material nanosheet;
    a first doped semiconductor portion, of the first conductivity type, on a first side of the doped epitaxial material structure and physically contacting sidewalls of each semiconductor material nanosheet; and
    a second doped semiconductor portion, of a second conductivity type, on a second side of the doped epitaxial material structure and physically contacting sidewalls of each semiconductor material nanosheet, wherein the first conductivity type is opposite from the second conductivity type.

2. The semiconductor structure of claim 1, further comprising:
    a first contact physically contacting the first doped semiconductor portion; and
    a second contact physically contacting the second doped semiconductor portion.

3. The semiconductor structure of claim 2, further comprising:
    an interlevel dielectric (ILD) material located above the first doped semiconductor portion, above the second doped semiconductor portion, above the doped epitaxial material structure, and laterally adjacent to each contact.

4. The semiconductor structure of claim 1, wherein the doped epitaxial material structure is doped with an n-type dopant and the doping concentration is 1e19 atoms/cm$^3$ to 4e20 atoms/cm$^3$.

5. The semiconductor structure of claim 1, wherein the first doped semiconductor portion is doped with an n-type dopant and the doping concentration is 4e20 atoms/cm$^3$ to 1.5e21 atoms/cm$^3$.

6. The semiconductor structure of claim 1, wherein the second doped semiconductor portion is doped with a p-type dopant and the doping concentration is 4e20 atoms/cm$^3$ to 1.5e21 atoms/cm$^3$.

7. The semiconductor structure of claim 1, wherein the first doped semiconductor portion is silicon doped with phosphorous.

8. The semiconductor structure of claim 1, wherein the second doped semiconductor portion is silicon germanium doped with boron.

9. A semiconductor structure comprising:
    a plurality of stacked and suspended semiconductor material nanosheets, of a first conductivity type, located above a semiconductor substrate;
    a doped epitaxial material structure, of the first conductivity type, surrounding each semiconductor material nanosheet;
    a doped epitaxial material capping layer, of the first conductivity type, on the doped epitaxial material structure, wherein the doped epitaxial material capping layer has a higher doping concentration than the doped epitaxial material structure; and
    a doped semiconductor portion, of a second conductivity type, on each side of the doped epitaxial material structure and physically contacting sidewalls of each semiconductor material nanosheet, wherein the first conductivity type is opposite from the second conductivity type.

10. The semiconductor structure of claim 9, further comprising:
    a first contact physically contacting the doped epitaxial material capping layer;
    a second contact physically contacting the doped semiconductor portion on a first side of the doped epitaxial material structure; and
    a third contact physically contacting the doped semiconductor portion on a second side of the doped epitaxial material structure.

11. The semiconductor structure of claim 10, further comprising:
    an interlevel dielectric (ILD) material located above each doped semiconductor portion, above the doped epitaxial material capping layer, and laterally adjacent to each contact.

12. The semiconductor structure of claim 9, wherein the doped epitaxial material structure is doped with a p-type dopant and the doping concentration is 1e17 atoms/cm$^3$ to 1e19 atoms/cm$^3$.

13. The semiconductor structure of claim 9, wherein the doped semiconductor portion is doped with an n-type dopant and the doping concentration is 4e20 atoms/cm$^3$ to 1.5e21 atoms/cm$^3$.

14. The semiconductor structure of claim 9, wherein the doped epitaxial material structure is silicon germanium doped with boron.

15. The semiconductor structure of claim 9, wherein the doped semiconductor portion is silicon doped with phosphorous.

16. A method for forming a semiconductor structure, the method comprising:
    providing a nanosheet stack of alternating nanosheets of a sacrificial semiconductor material nanosheet and a semiconductor material nanosheet located on a surface of a semiconductor substrate, wherein a sacrificial gate structure and a dielectric spacer material layer straddle over the nanosheet stack;

recessing end portions of each of the sacrificial semiconductor material nanosheets to provide a gap between each of the semiconductor material nanosheets;

forming an additional dielectric spacer material layer within each gap;

forming a plurality of doped semiconductor portions by epitaxial growth of at least one semiconductor material on the physically exposed sidewalls of each semiconductor material nanosheet, wherein the plurality of doped semiconductor portions are present on the surface of the semiconductor substrate;

thermally annealing the semiconductor structure such that a dopant diffuses into at least a first portion of the semiconductor material nanosheets;

removing: (i) the sacrificial gate structure, (ii) each sacrificial semiconductor material nanosheet, and (iii) the dielectric spacer material layer;

forming a doped epitaxial material structure by epitaxial growth of a semiconductor material in regions occupied by each sacrificial semiconductor material nanosheet, wherein the doped epitaxial material structure wraps around each suspended semiconductor material nanosheet.

17. The method of claim 16, further comprising:
forming a first contact physically contacting a first doped semiconductor portion on a first side of the doped epitaxial material structure;
forming a second contact physically contacting a second doped semiconductor portion on a second side of the doped epitaxial material structure.

18. The method of claim 17, wherein the conductivity type of the first semiconductor portion is opposite to the conductivity type of the second doped semiconductor portion.

19. The method of claim 17, wherein the conductivity type of the first doped semiconductor portion matches the conductivity type of the second doped semiconductor portion.

20. The method of claim 19, further comprising:
forming a doped epitaxial material capping layer on the doped epitaxial material structure, wherein the doped epitaxial material capping layer has a higher doping concentration than the doped epitaxial material structure; and
forming a third contact physically contacting the doped epitaxial material capping layer.

* * * * *